US012772383B1

(12) United States Patent
Prezioso

(10) Patent No.: US 12,772,383 B1
(45) Date of Patent: Oct. 20, 2026

(54) APPARATUS, SYSTEM, AND METHOD FOR BACKDRILLING VIAS BASED ON DEPTH MEASUREMENTS TAKEN DURING PRIMARY DRILLING APPLICATIONS

(71) Applicant: Juniper Networks, Inc., Sunnyvale, CA (US)

(72) Inventor: Daniel J Prezioso, Newbury, MA (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 301 days.

(21) Appl. No.: 18/605,741

(22) Filed: Mar. 14, 2024

(51) Int. Cl.
*H05K 3/00* (2006.01)

(52) U.S. Cl.
CPC ... *H05K 3/0047* (2013.01); *H05K 2203/0207* (2013.01); *H05K 2203/163* (2013.01)

(58) Field of Classification Search
CPC ......... H05K 3/0047; H05K 2203/0207; H05K 2203/163
See application file for complete search history.

(56) References Cited

U.S. PATENT DOCUMENTS 5,123,789 A * 6/1992 Ohtani ............... G05B 19/4166 408/1 R
7,669,321 B1 * 3/2010 Levy .................... H05K 1/0268 29/402.06
8,212,153 B2 * 7/2012 Matsui ................... H05K 3/403 174/262
10,917,976 B1 * 2/2021 Wilkinson ............. H05K 3/425
11,570,908 B2 * 1/2023 Wilkinson ........... H05K 1/0251
11,690,177 B2 * 6/2023 Tourne ................. H05K 3/0047 29/829
2014/0093321 A1 * 4/2014 Liu ......................... B23B 41/14 408/1 R
2016/0052068 A1 * 2/2016 Winterschladen ...... B23B 49/00 408/1 BD

* cited by examiner

*Primary Examiner* — Ryan J. Walters
(74) *Attorney, Agent, or Firm* — ALG Intellectual Property, LLC

(57) ABSTRACT

A system for backdrilling vias based on depth measurements taken during primary drilling applications is disclosed. This system may include a drilling machine configured to drill holes into circuit boards via a conductive drill bit and circuitry communicatively coupled to the drilling machine. The circuitry may be configured to measure a depth of a ground layer within a circuit board based at least in part on contact made between the conductive drill bit and the ground layer. Additionally or alternatively, the circuitry may be configured to calculate a depth of an electrical layer located proximate to the ground layer within the circuit board based at least in part on the depth of the ground layer to avoid drilling into the electrical layer. Various other apparatuses, systems, and methods are also disclosed.

20 Claims, 4 Drawing Sheets

APPARATUS, SYSTEM, AND METHOD FOR BACKDRILLING VIAS BASED ON DEPTH MEASUREMENTS TAKEN DURING PRIMARY DRILLING APPLICATIONS

BACKGROUND

Circuit boards, such as printed circuit boards (PCBs), often include and/or represent multiple layers that are coupled and/or laminated together. As PCBs become thicker due to increased numbers of layers and/or varying copper coverages, it may be difficult and/or challenging for PCB manufacturers to predict where each layer lies physically along the z-axis of the PCBs. Unfortunately, this inability to predict the physical location of each layer within the PCBs may prevent the PCB manufacturers from protecting certain layers (e.g., target must not cut (MNC) layers) and/or from satisfying and/or achieving the tight requirements for back-drill stub tolerances (e.g., between 2 and 6 mils). The instant disclosure, therefore, identifies and addresses a need for apparatuses, systems, and methods for backdrilling vias that satisfy and/or achieve the tight requirements for such stub tolerances.

SUMMARY

As will be described in greater detail below, the instant disclosure generally relates to apparatuses, systems, and methods for backdrilling vias based on depth measurements taken during primary drilling applications. In one example, a system for accomplishing such a task may include a drilling machine configured to drill holes into circuit boards via a conductive drill bit and circuitry communicatively coupled to the drilling machine. In this example, the circuitry may be configured to measure a depth of a ground layer within a circuit board based at least in part on contact made between the conductive drill bit and the ground layer. Additionally or alternatively, the circuitry may be configured to calculate a depth of an electrical layer located proximate to the ground layer within the circuit board based at least in part on the depth of the ground layer to avoid drilling into the electrical layer (e.g., a target MNC layer).

Similarly, an apparatus for accomplishing such a task may include a drilling machine configured to drill holes into circuit boards via a conductive drill bit. In one example, the apparatus may also include a sensor that is communicatively coupled to the conductive drill bit and configured to sense an alteration made to an electrical signal passing through the conductive drill bit. The apparatus may further include circuitry communicatively coupled to the drilling machine. In this example, the circuitry may be configured to measure a depth of a ground layer within a circuit board based at least in part on contact detected between the conductive drill bit and the ground layer from the alteration made to the electrical signal. Additionally or alternatively, the circuitry may be configured to calculate a depth of an electrical layer located proximate to the ground layer within the circuit board based at least in part on the depth of the ground layer to avoid drilling into the electrical layer.

A corresponding method may include (1) measuring, by circuitry, a depth of a ground layer within a circuit board based at least in part on contact made between a conductive drill bit and the ground layer, (2) calculating, by the circuitry, a depth of an electrical layer located proximate to the ground layer within the circuit board based at least in part on the depth of the ground layer, and (3) directing, by the circuitry, a drilling machine to drill a hole that ends before the electrical layer based at least in part on the depth.

Features from any of the above-mentioned embodiments may be used in combination with one another in accordance with the general principles described herein. These and other embodiments, features, and advantages will be more fully understood upon reading the following detailed description in conjunction with the accompanying drawings and claims.

BRIEF DESCRIPTION OF THE DRAWINGS

The accompanying drawings illustrate a number of exemplary embodiments and are a part of the specification. Together with the following description, these drawings demonstrate and explain various principles of the instant disclosure.

Figure 1:
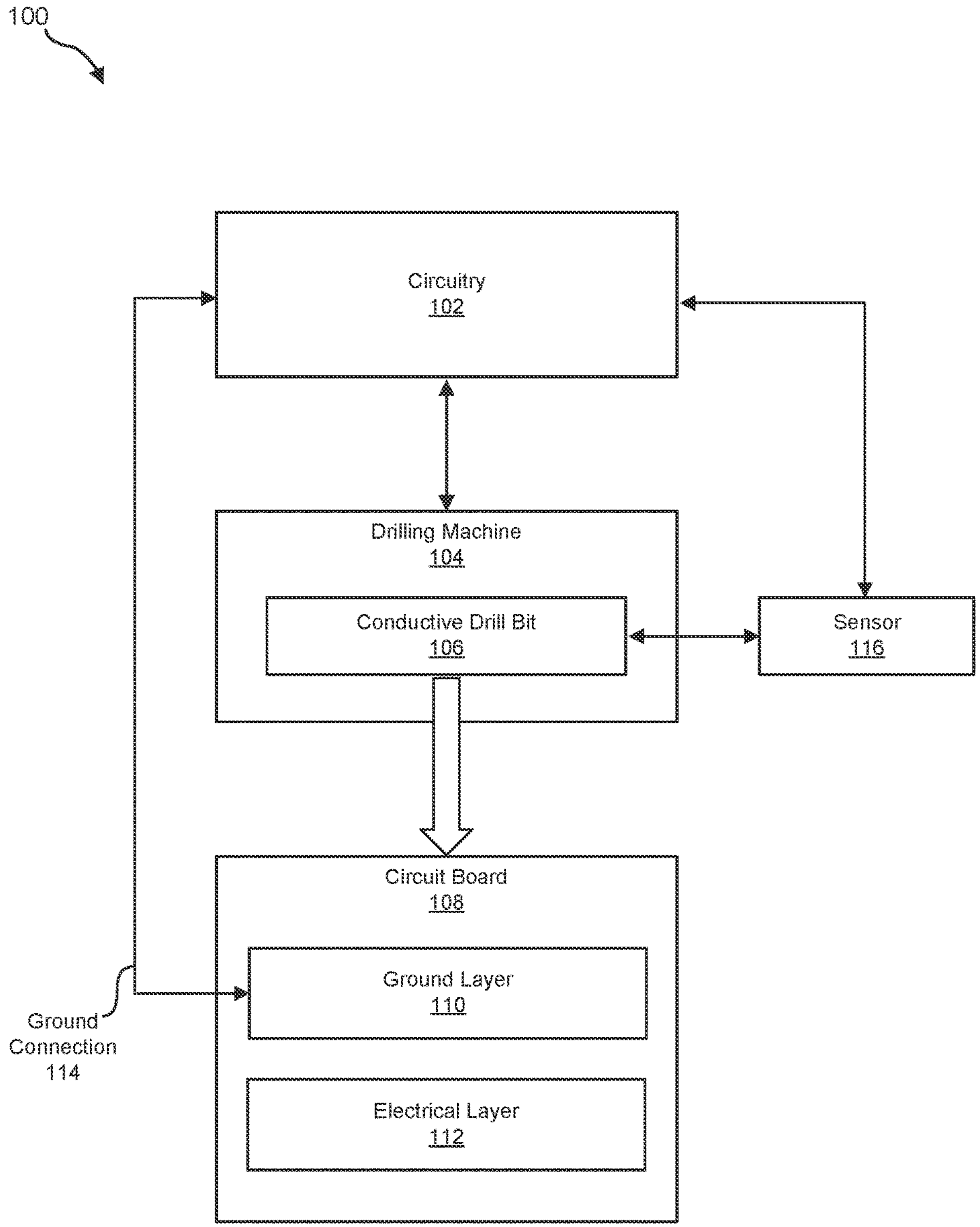
FIG. 1 is an illustration of an exemplary system for backdrilling vias based on depth measurements taken during primary drilling applications according to one or more embodiments of this disclosure.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the instant disclosure covers all modifications, equivalents, and alternatives falling within the scope of the appended claims.

DETAILED DESCRIPTION OF EXEMPLARY EMBODIMENTS

The present disclosure describes various apparatuses, systems, and methods for backdrilling vias based on depth measurements taken during primary drilling applications. As will be explained in greater detail below, embodiments of the instant disclosure may measure the depths of ground layers within circuit boards during the primary drilling applications. In some examples, a primary drilling application may involve and/or represent the process during which electrical vias (such as ground vias, power vias, signal vias, etc.) are drilled into a circuit board. Such embodiments may involve deriving, extrapolating, and/or determining the location of certain electrical layers (such as power layers, signal layers, target MNC layers, etc.) based at least in part on knowledge of nearby ground layers and/or depth measurements taken during the primary drilling applications. By doing so, these embodiments may avoid and/or prevent drilling into such electrical layers.

As an example, a drilling machine may include and/or represent circuitry that establishes a ground connection with a multilayer PCB and/or generates an electrical signal that passes through a conductive drill bit. In this example, the drilling machine may use the conductive drill bit to create a hole for a ground via along the z-axis of the multilayer PCB. The drilling machine may also include and/or represent a sensor that senses and/or detects contact made between the conductive drill bit and a ground layer within the PCB as the conductive drill bit creates the hole. The sensor may be able to sense and/or detect such contact based at least in part on changes and/or alterations in the electrical signal caused by the ground layer.

Continuing this example, the circuitry may be programmed and/or configured with data and/or information that identifies and/or indicates the thickness of the ground layer and/or the thickness of at least one material (e.g., dielectrics, additional layers, etc.) between the ground layer and a nearby electrical layer (e.g., a power or signal layer). The circuitry may be able to calculate, compute, and/or determine the depth of the electrical layer within the PCB by summing and/or adding up the depth of the ground layer, the thickness of the ground layer, and/or the thickness of that material.

Continuing with this example, the circuitry may measure and/or map the overall thickness of the PCB via a pressure foot. The circuitry may also be programmed and/or configured with data and/or information that identifies and/or indicates the thickness of the electrical layer. The circuitry may calculate, compute, and/or determine a combination and/or sum of the depth of the electrical layer, the thickness of the electrical layer, and/or a tolerance measurement (e.g., a backdrill stub length). The circuitry may then calculate, compute, and/or determine the depth of a backdrill hole to be drilled in the PCB by subtracting the summed combination from the thickness of the PCB. Finally, the circuitry may direct and/or cause the drilling machine to drill the backdrill hole in the PCB in accordance with the calculated depth of the backdrill hole. In certain implementations, the ground-via hole and the backdrill hole may be drilled and/or created on opposite sides of the PCB and/or in opposite directions.

Figure 2:
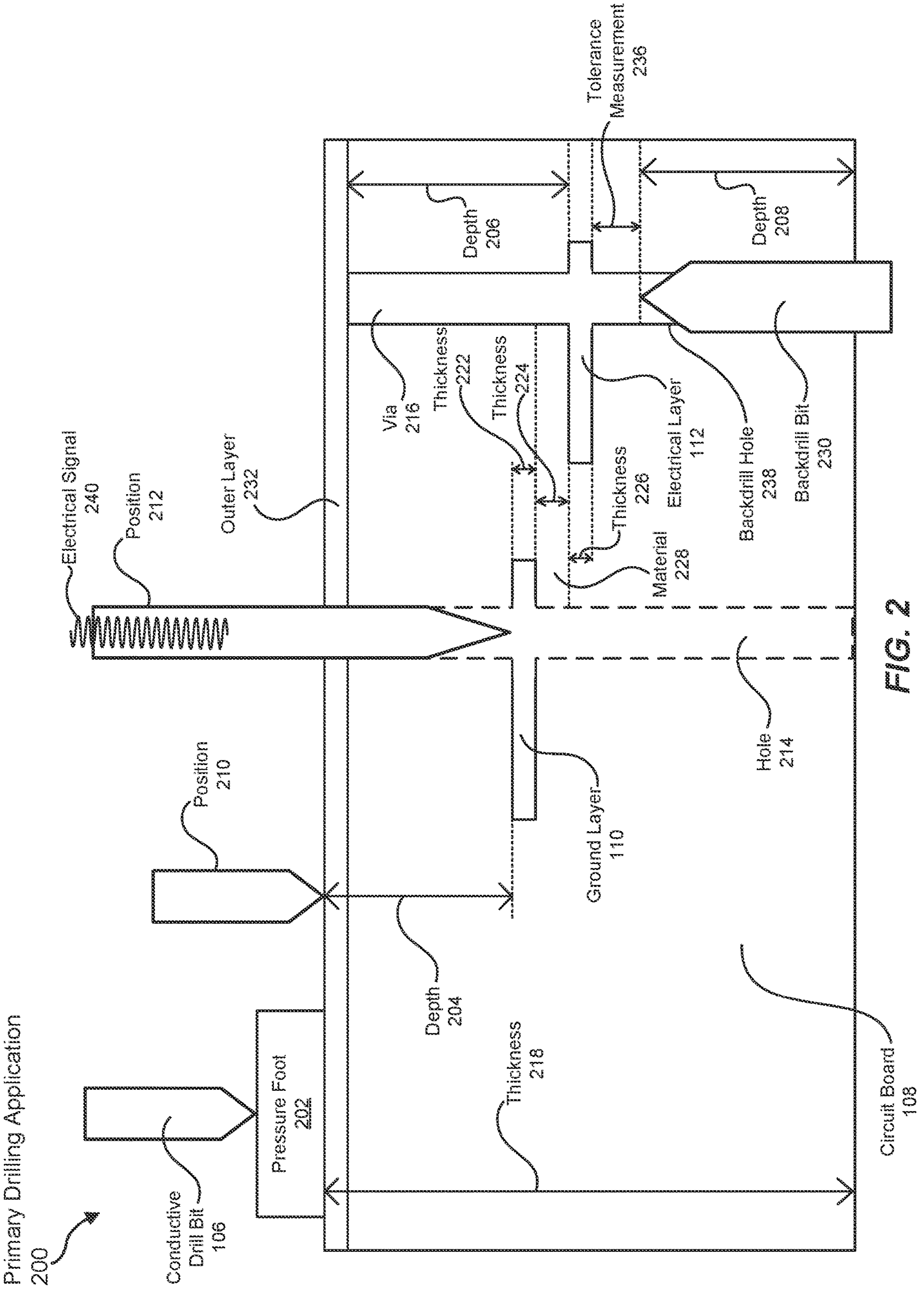
FIG. 2 is an illustration of an exemplary primary drilling application that involves taking depth measurements for use in backdrilling vias according to one or more embodiments of this disclosure.
Figure 3:
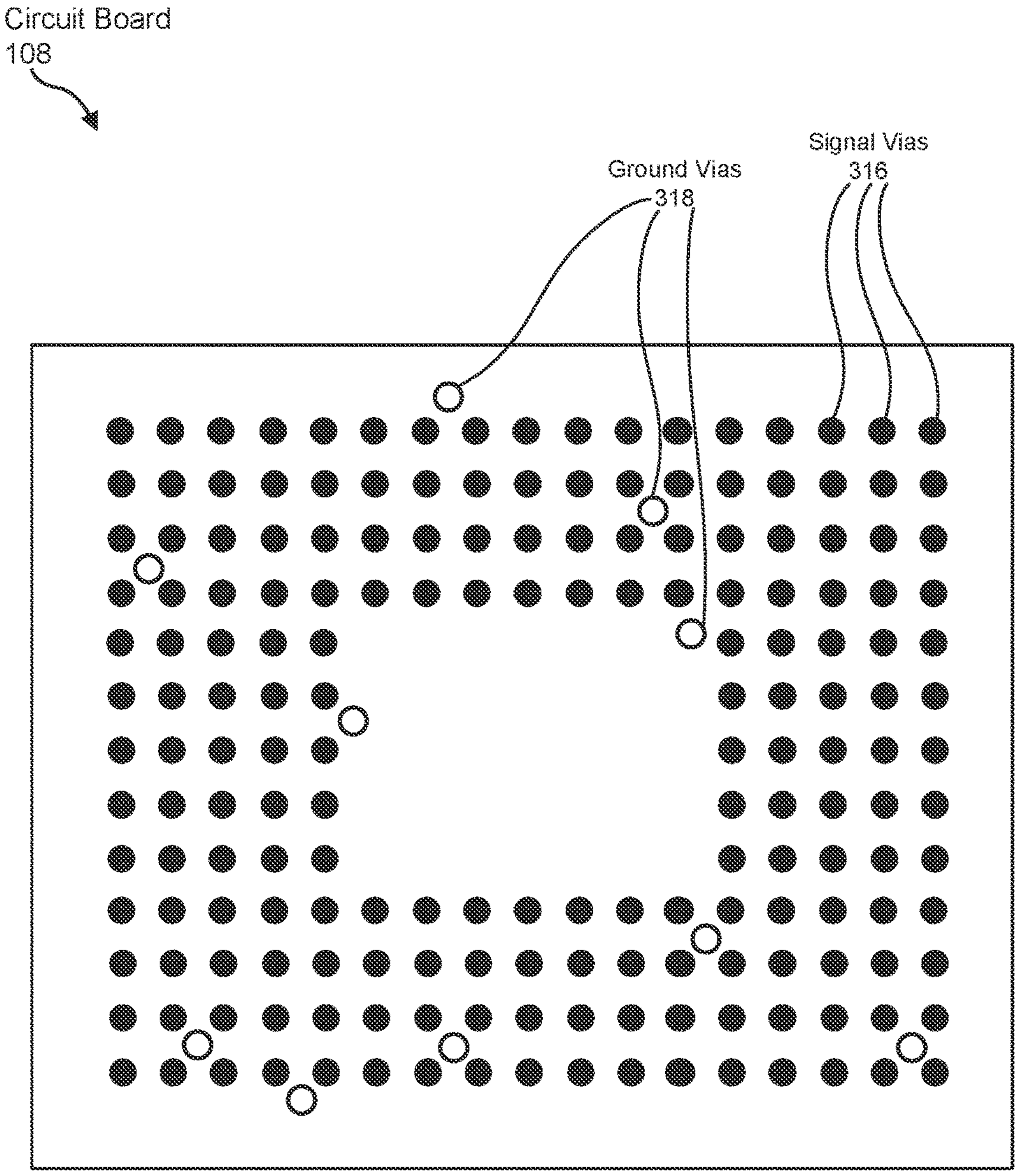
FIG. 3 is an illustration of an exemplary circuit board that facilitates backdrilling vias based on depth measurements taken during primary drilling applications according to one or more embodiments of this disclosure.

The following will provide, with reference to FIG. 1-3, detailed descriptions of exemplary components, apparatuses, systems, configurations, and/or implementations for backdrilling vias based on depth measurements taken during primary drilling applications. In addition, the discussion corresponding to FIG. 4 will provide a detailed description of an exemplary method for backdrilling vias based on depth measurements taken during primary drilling applications.

FIG. 1 illustrates an exemplary system 100 that includes and/or represents a system 100 for backdrilling vias based on depth measurements taken during primary drilling applications. In some examples, system 100 may include and/or represent circuitry 102 and/or a drilling machine 104. Additionally or alternatively, system 100 may include and/or represent a sensor 116. In one example, circuitry 102 may establish, create, and/or form a ground connection 114 with a circuit board 108. In this example, circuit board 108 may include and/or represent a ground layer 110 and/or an electrical layer 112. Ground layer 110 may be communicatively and/or electrically coupled to the electrical ground of circuitry 102 via electrical connection 114.

In some examples, drilling machine 104 may include and/or represent a conductive drill bit 106 through which an electrical signal (e.g., an oscillating signal and/or a stationary signal) passes and/or traverses. In one example, circuitry 102 may generate and/or create the electrical signal for transmission and/or propagation through conductive drill bit 106. The electrical signal may pass and/or traverse through conductive drill bit 106 for the purpose of enabling circuitry 102 to detect contact made between conductive drill bit 106 and ground layer 110 while a hole and/or ground via is drilled into circuit board 108 (e.g., during a primary drilling application). For example, circuitry 102 may transmit the electrical signal through conductive drill bit 106 to detect and/or determine when conductive drill bit 106 reaches and/or contacts ground layer 110 while drilling a hole for a ground via that runs along the z-axis of circuit board 108.

In some examples, circuitry 102 may measure, calculate, and/or determine the depth of ground layer 110 within circuit board 108 based at least in part on the contact made between conductive drill bit 106 and ground layer 110. For example, sensor 116 may be communicatively and/or electrically coupled to conductive drill bit 106 and/or circuitry 102. In this example, sensor 116 may be able to detect and/or sense alterations and/or changes in the electrical signal passing through conductive drill bit 106. Additionally or alternatively, circuitry 102 may detect and/or sense the contact made between conductive drill bit 106 and ground layer 110 as conductive drill bit 106 drills a hole for a ground via toward ground layer 110 during the primary drilling application. In certain implementations, circuitry 102 may detect and/or sense such contact based at least in part on an output of sensor 116 that shows and/or indicates an alteration and/or change made to the electrical signal passing through conductive drill bit 106 by ground layer 110.

In some examples, circuitry 102 may calculate, compute, and/or determine the depth of electrical layer 112 within circuit board 108 based at least in part on the depth of ground layer 110 to avoid and/or prevent drilling into electrical layer 112. For example, circuitry 102 may obtain and/or be programmed with data and/or information that identifies a distance between ground layer 110 and electrical layer 112 within circuit board 108. In this example, circuitry 102 may derive, extrapolate, and/or determine the location and/or position of electrical layer 112 based at least in part on the location and/or position of ground layer 110 and knowledge about the distance between ground layer 110 and electrical layer 112.

In one example, circuitry 102 may direct and/or cause drilling machine 104 to drill a hole that ends before reaching and/or contacting electrical layer 112 within circuit board 108. For example, in response to a command and/or instruction from circuitry 102, drilling machine 104 may backdrill a hole toward electrical layer 112 for a power or signal via in circuit board 108. In this example, the backdrill hole may be positioned and/or formed in a side and/or direction opposite of the hole drilled for the ground via.

In some examples, circuitry 102 may include and/or represent one or more electrical and/or electronic circuits capable of processing, applying, modifying, transforming, displaying, transmitting, receiving, and/or executing data for system 100. In one example, circuitry 102 may access and/or analyze data stored in memory to facilitate and/or support backdrilling vias based on depth measurements taken during primary drilling applications. Additionally or alternatively, circuitry 102 may launch, perform, and/or execute certain executable files, code snippets, and/or computer-readable instructions to facilitate and/or support backdrilling vias based on depth measurements taken during primary drilling applications.

Although illustrated as a single unit in FIG. 1, circuitry 102 may include and/or represent a collection of multiple processing units and/or electrical or electronic components that work and/or operate in conjunction with one another. In one example, circuitry 102 may include and/or represent at least one CPU. In another example, circuitry 102 may include and/or represent at least one application-specific integrated circuit (ASIC). Additional examples of circuitry 102 include, without limitation, processing devices, microprocessors, microcontrollers, graphics processing units (GPUs), field-programmable gate arrays (FPGAs), systems on chips (SoCs), parallel accelerated processors, tensor cores, integrated circuits, chiplets, optical modules, receivers, transmitters, transceivers, optical modules, memory devices, sensors (e.g., sensor 116), portions of one or more of the same, variations or combinations of one or more of the same, and/or any other suitable circuitry. In certain implementations, circuitry 102 may be included and/or incorporated in drilling machine 104.

In some examples, drilling machine 104 may include and/or represent one or more components, devices, and/or mechanisms that facilitate and/or support drilling holes in circuit boards. For example, drilling machine 104 may include and/or represent a PCB router, computer numerical control (CNC) router, and/or milling machine equipped with one or more motors and/or drill bits. In one example, drilling machine 104 may be controlled and/or operated by circuitry 102.

In some examples, circuit board 108 may include and/or incorporate one or more electrically conductive materials in layers, such as ground layer 110 and/or electrical layer 112. In one example, such layers may include and/or represent a plane of conductive material that is etched during the fabrication process to create various conductive paths, tracks, and/or traces throughout circuit board 108. In this example, the etched conductive paths, tracks, and/or traces may be separated from and/or interconnected with one another as necessary to form one or more circuits that incorporate electrical components and/or electronics across circuit board 108. Examples of such electrically conductive materials include, without limitation, copper, aluminum, silver, gold, alloys of one or more of the same, combinations or variations of one or more of the same, and/or any other suitable materials.

In some examples, circuit board 108 may include and/or incorporate insulating material that facilitates mounting (e.g., mechanical support) and/or interconnection (e.g., electrical coupling) of electrical and/or electronic components. In one example, circuit board 108 may include and/or represent a PCB. Additionally or alternatively, circuit board 108 may constitute and/or represent a set of PCBs that are laminated together. Examples of circuit board 108 include, without limitation, multilayer boards, motherboards, linecards, backplanes, midplanes, and/or any other suitable type of circuit board. Circuit board 108 may be deployed and/or run in a computing device, such as a router, switch, gateway, network node, and/or end-point computer, among others.

In some examples, circuit board 108 may be created and/or produced by a variety of fabrication processes. Examples of such fabrication processes include, without limitation, lamination, lithography, etching, deposition, chemical mechanical planarization, oxidation, ion implantation, photolithography, diffusion, combinations or variations of one or more of the same, and/or any other suitable fabrication processes. Various components may be laminated, etched, attached, and/or otherwise coupled to circuit board 108.

Some of the layers in circuit board 108 may each include and/or represent sublaminates, insulation, and/or dielectric substances that electrically insulates the conductive materials from another. In one example, the insulation and/or dielectric substances may be disposed, laid out, and/or applied as planes and/or layers between each of the conductive planes and/or layers. In this example, the insulation and/or dielectric substances may constitute and/or represent a poor conductor of electricity. Additionally or alternatively, the insulation and/or dielectric substances may be polarized by an applied electric field.

Dielectric substances may be implemented as solids, liquids, and/or gases. Examples of dielectric substances include, without limitation, porcelains, glasses, plastics, industrial coatings, silicon, germanium, gallium arsenide, mica, metal oxides, silicon dioxides, sapphires, aluminum oxides, polymers, ceramics, variations or combinations of one or more of the same, and/or any other suitable dielectric substances.

In some examples, circuit board 108 may be fabricated in any of a variety of ways, including sequential lamination. For example, as part of a sequential lamination process, circuit board 108 may be fabricated layer by layer, using certain subcomposites of copper and insulating materials. In this example, the sequential lamination process may facilitate trace routing and/or via drilling within internal planes and/or layers.

In some examples, circuit board 108 may include and/or form a symmetrical configuration of layers. In other examples, circuit board 108 may include and/or form an asymmetrical configuration of layers.

FIG. 2 illustrates an exemplary primary drilling application 200 in which one or more holes are drilled in circuit board 108. In some examples, primary drilling application 200 may include and/or involve certain components, configurations, and/or features that perform and/or provide functionalities that are similar and/or identical to those described above in connection with FIG. 1. In one example, circuitry 102 may calculate, determine, and/or identify thickness 222 of ground layer 110, a thickness of 226 of electrical layer 112, and/or a thickness 224 of a material 228 positioned and/or placed between ground layer 110 and electrical layer 112 within circuit board 108. For example, circuitry 102 may access data and/or information stored in memory and/or inputted by a user or operator. In this example, the data and/or information may indicate and/or specify thickness 222 of ground layer 110, thickness 226 of electrical layer 112, and/or thickness 224 of material 228.

As a specific example, circuitry 102 may determine thickness 224 of material 228 by accessing the data and/or information stored in memory. In this example, the data and/or information accessed by circuitry 102 may identify and/or indicate thickness 224 of material 228. Circuitry 102 may apply thickness 224 of material 228 to a formula in order to calculate the depth of electrical layer 112 within circuit board 108.

In some examples, circuitry 102 may calculate, compute, and/or determine a depth 206 of electrical layer 112 within circuit board 108 (e.g., from at least one side) by summing and/or adding up a depth 204 of ground layer 110, thickness 222 of ground layer 110, and/or thickness 224 of material 228. Accordingly, from the perspective of the side in which the ground-via hold is drilled in circuit board 108, depth 206 of electrical layer 112 may correspond to and/or be commensurate with the sum of depth 204 of ground layer 110, thickness 222 of ground layer 110, and/or thickness 224 of material 228.

In some examples, material 228 may include and/or represent dielectric substances that electrically isolate and/or insulate layers from one another. Additionally or alternatively, material 228 may include and/or represent one or more layers positioned and/or located between ground layer 110 and electrical layer 112. In one example, ground layer 110 and electrical layer 112 may be positioned and/or located directly proximate and/or next to one another without any intervening and/or intermediate layers within circuit board 108. In this example, ground layer 110 and electrical layer 112 may be separated and/or removed from one another by only dielectric material within circuit board 108. In another example, ground layer 110 and electrical layer 112 may be separated and/or removed from one another by dielectric material and/or one or more intervening and/or intermediate layers (e.g., one or two layers) within circuit board 108.

In some examples, circuitry 102 may utilize and/or apply a pressure foot 202 to calculate, measure, map, and/or determine a thickness 218 of circuit board 108. In one example, pressure foot 202 may constitute and/or represent a part of system 100 that is coupled to circuit board 108. In this example, circuitry 102 may measure and/or map thickness 218 of circuit board 108 via pressure foot 202. Additionally or alternatively, circuitry 102 may detect and/or identify an outer layer 232 based at least in part on initial contact made between conductive drill bit 106 and outer layer 232. In certain implementations, outer layer 232 may include and/or represent a sheet of conductive entry material that rests on circuit board 108 for primary drilling application 200. In other implementations, outer layer 232 may constitute and/or represent a conductive plane and/or layer incorporated into the top of circuit board 108.

In some examples, circuitry 102 may determine and/or identify a numerical representation of a position 210 of conductive drill bit 106 when making initial contact with outer layer 232. In one example, circuitry 102 may determine and/or identify a numerical representation of a position 212 of conductive drill bit 106 when making contact with ground layer 110 of circuit board 108. For example, circuitry 102 may detect contact between conductive drill bit 106 and ground layer 110 based at least in part on one or more changes or alterations made to an electrical signal 240 passing through conductive drill bit 106 by ground layer 110. In this example, circuitry 102 may calculate, compute, and/or determine depth 204 of ground layer 110 by subtracting the numerical representation of position 210 from the numerical representation of position 212 or vice versa. Accordingly, depth 204 of ground layer 110 may constitute and/or represent a delta and/or differential between position 210 and position 212.

In some examples, circuitry 102 may direct and/or cause drilling machine 104 to move, position, and/or place conductive drill bit 106 at position 210 relative to circuit board 108. In one example, circuitry 102 may direct and/or cause drilling machine 104 to drill a hole 214 for a ground via by milling out between positions 210 and 212 with conductive drill bit 106. In this example, circuitry 102 may calculate, compute, and/or measure a length and/or distance between position 210 and the opposing side of electrical layer 112 by summing and/or adding up depth 206 of electrical layer 112, thickness 226 of electrical layer 112, and/or a tolerance measurement 236. In certain implementations, tolerance measurement 236 may include and/or represent a backdrill stub length and/or tolerance (e.g., between 2 and 6 mils).

In some examples, circuitry 102 may calculate, compute, and/or determine a depth 208 of a backdrill hole 238 to be drilled in circuit board 108 by subtracting the length and/or distance between position 210 and the opposing side of electrical layer 112 from thickness 218 of circuit board 108. In one example, circuitry 102 may direct and/or cause drilling machine 104 to drill backdrill hole 238 in circuit board 108 in accordance with the depth 208. In this example, hole 214 may be drilled and/or initiated from the side of outer layer 232 on circuit board 108, and backdrill hole 238 may be drilled and/or initiated from the side opposite outer layer 232.

In certain implementations, backdrill hole 238 may effectively remove and/or delete conductive material from a via 216 formed along the z-axis of circuit board 108. In some examples, system 100 may implement and/or deploy a backdrill bit 230 to create and/or form backdrill hole 238. In one example, backdrill bit 230 may have a larger diameter than conductive drill bit 106 to facilitate the removal of conductive material from via 216.

In some examples, circuitry 102 may record and/or store the x-axis and/or y-axis coordinates of the holes drilled for ground vias, which are simultaneously used to indirectly sense and/or measure the depths of power and/or signal vias along the z-axis. In one example, circuitry 102 may maintain those records and/or data entries for each circuit board because the depths of the power and/or signal vias vary from one circuit board to the next. In a specific example, circuitry 102 may sense and/or measure the depths of the power and/or signal vias by applying this ground-via sensing technique in an approximate 1-inch grid and/or area of each circuit board to minimize and/or optimize the manufacturing cycle time.

FIG. 3 illustrates an exemplary implementation of a portion of circuit board 108, which includes ground vias 318 and signal vias 316. In some examples, circuit board 108 may include and/or involve certain components, configurations, and/or features that perform and/or provide functionalities that are similar and/or identical to those described above in connection with either FIG. 1 or FIG. 2. In one example, the portion of circuit board 108 illustrated in FIG. 3 may include and/or represent an approximate 1-inch grid and/or area. In this example, ground vias 318 of circuit board 108 may be used by circuitry 102 to calculate, compute, and/or determine the depths of backdrills for signal vias 316 of circuit board 108. By using ground vias 318 in this way, circuitry 102 may be able to measure the depths of such backdrills during the primary drilling application. Moreover, by using ground vias 318 in this way, circuitry 102 may be able to measure the depths of such backdrills without disturbing signal vias 316 or without relying purely on estimates of where certain electrical layers are located and/or positioned within circuit board 108.

In some examples, the various systems, components, and/or features described in connection with FIGS. 1-3 may include and/or represent one or more additional circuits, components, and/or features that are not necessarily illustrated and/or labeled in FIGS. 1-3. For example, the systems, components, and/or features illustrated in FIGS. 1-3 may also include and/or represent additional analog and/or digital circuitry, onboard logic, transistors, radio-frequency (RF) transmitters, RF receivers, transceivers, antennas, resistors, capacitors, diodes, inductors, switches, registers, flipflops, digital logic, connections, traces, buses, semiconductor (e.g., silicon) devices and/or structures, processing devices, storage devices, memory devices, circuit boards, sensors, packages, substrates, housings, servers, client devices, computing devices, combinations or variations of one or more of the same, and/or any other suitable components. In certain implementations, one or more of these additional circuits, components, and/or features may be inserted and/or applied between any of the existing circuits, components, and/or features illustrated in FIGS. 1-3 consistent with the aims and/or objectives described herein. Accordingly, the couplings and/or connections described with reference to FIGS. 1-3 may be direct connections with no intermediate components, devices, and/or nodes or indirect connections with one or more intermediate components, devices, and/or nodes.

In some examples, the phrase "to couple" and/or the term "coupling", as used herein, may refer to a direct connection and/or an indirect connection. For example, a direct coupling between two components may constitute and/or represent a coupling in which those two components are directly connected to each other by a single node that provides continuity from one of those two components to the other. In other words, the direct coupling may exclude and/or omit any additional components between those two components.

Additionally or alternatively, an indirect coupling between two components may constitute and/or represent a coupling in which those two components are indirectly connected to each other by multiple nodes that fail to provide continuity from one of those two components to the other. In other words, the indirect coupling may include and/or incorporate at least one additional component between those two components.

Figure 4:
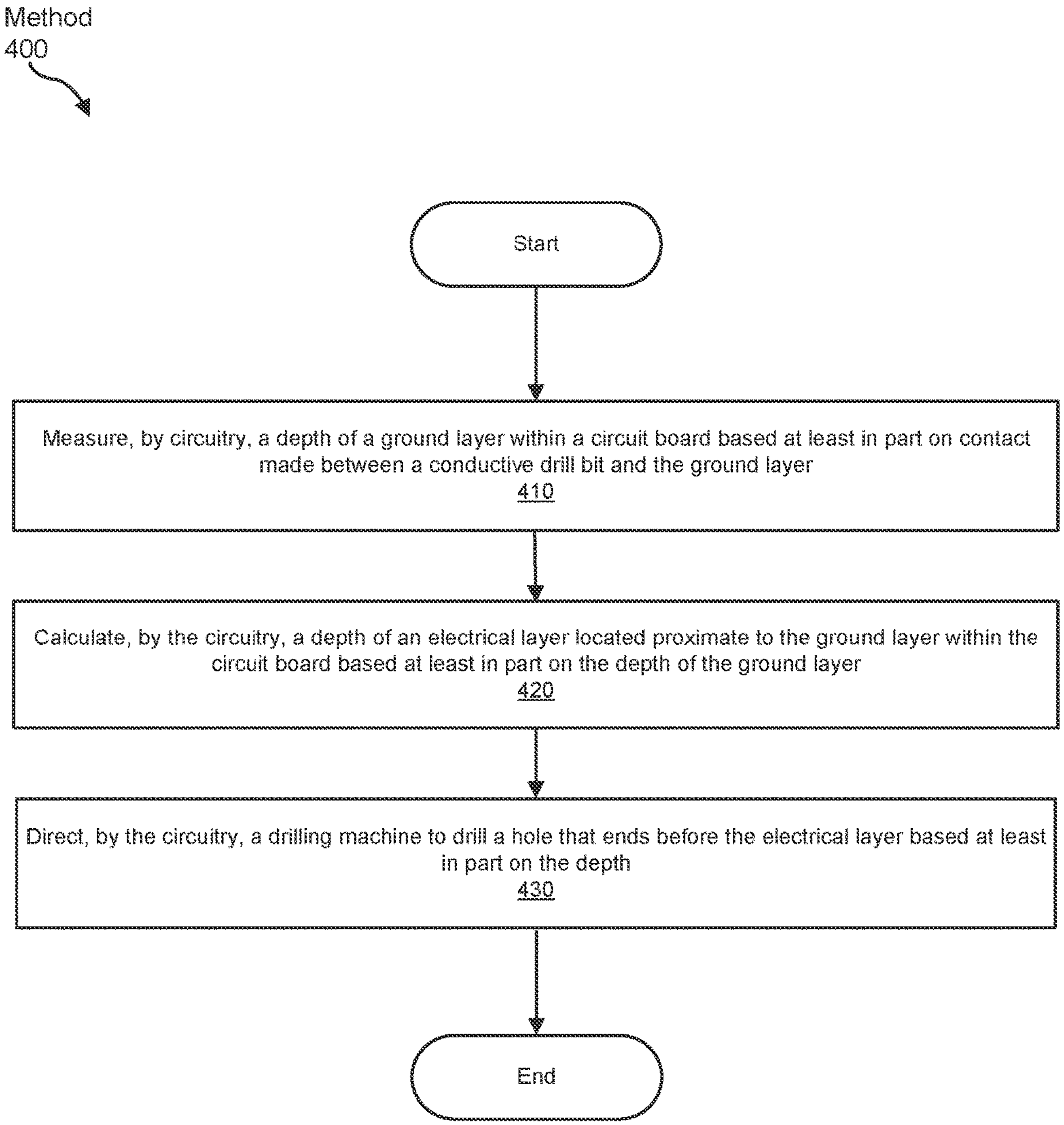
FIG. 4 is a flow diagram of an exemplary method for backdrilling vias based on depth measurements taken during primary drilling applications according to one or more embodiments of this disclosure.

FIG. 4 is a flow diagram of an exemplary method 400 for backdrilling vias based on depth measurements taken during primary drilling applications. In one example, the steps shown in FIG. 4 may be performed by a circuitry incorporated in a PCB router and/or drilling machine. Additionally or alternatively, the steps shown in FIG. 4 may incorporate and/or involve certain sub-steps and/or variations consistent with the descriptions provided above in connection with FIGS. 1-3.

As illustrated in FIG. 4, method 400 may include and/or involve the step of measuring a depth of a ground layer within a circuit board based at least in part on contact made between the conductive drill bit and the ground layer (410). Step 410 may be performed in a variety of ways, including any of those described above in connection with FIGS. 1-3. For example, circuitry may measure a depth of a ground layer within a circuit board based at least in part on contact made between the conductive drill bit and the ground layer.

Method 400 may also include and/or involve the step of calculating a depth of an electrical layer located proximate to the ground layer within the circuit board based at least in part on the depth of the ground layer (420). Step 420 may be performed in a variety of ways, including any of those described above in connection with FIGS. 1-3. For example, the circuitry may calculate a depth of an electrical layer located proximate to the ground layer within the circuit board based at least in part on the depth of the ground layer.

Method 400 may further include and/or involve the step of direct a drilling machine to drill a hole that ends before the electrical layer based at least in part on the depth (430). Step 430 may be performed in a variety of ways, including any of those described above in connection with FIGS. 1-3. For example, the circuitry may direct a drilling machine to drill a hole that ends before the electrical layer based at least in part on the depth.

In some examples, one or more of the exemplary embodiments disclosed herein may be encoded as a computer program (also referred to as computer software, software applications, computer-readable instructions, and/or computer control logic) on a computer-readable medium. The term "computer-readable medium" generally refers to any form of device, carrier, or medium capable of storing or carrying computer-readable instructions. Examples of computer-readable media include, without limitation, transmission-type media, such as carrier waves, and non-transitory-type media, such as magnetic-storage media (e.g., hard disk drives and floppy disks), optical-storage media (e.g., Compact Disks (CDs) and Digital Video Disks (DVDs)), electronic-storage media (e.g., solid-state drives and flash media), and other distribution systems.

While the foregoing disclosure sets forth various embodiments using specific block diagrams, flowcharts, and examples, each block diagram component, flowchart step, operation, and/or component described and/or illustrated herein may be implemented, individually and/or collectively, using a wide range of hardware, software, or firmware (or any combination thereof) configurations. In addition, any disclosure of components contained within other components should be considered exemplary in nature since many other architectures can be implemented to achieve the same functionality.

In some examples, all or a portion of system 100 may represent portions of a cloud-computing or network-based environment. Cloud-computing and network-based environments may provide various services and applications via the Internet. These cloud-computing and network-based services (e.g., software as a service, platform as a service, infrastructure as a service, etc.) may be accessible through a web browser or other remote interface. Various functions described herein may also provide network switching capabilities, gateway access capabilities, network security functions, content caching and delivery services for a network, network control services, and/or and other networking functionality.

In addition, one or more of the modules described herein may transform data, physical devices, and/or representations of physical devices from one form to another. Additionally or alternatively, one or more of the modules recited herein may transform a processor, volatile memory, non-volatile memory, and/or any other portion of a physical computing device from one form to another by executing on the computing device, storing data on the computing device, and/or otherwise interacting with the computing device.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the instant disclosure. The embodiments disclosed herein should be considered in all respects illustrative and not restrictive. Reference should be made to the appended claims and their equivalents in determining the scope of the instant disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including"

and "having" (and their derivatives), as used in the specification and claims, are interchangeable with and have the same meaning as the word "comprising."

What is claimed is:

1. A system comprising:

a drilling machine to drill a hole into a circuit board with a conductive drill bit;

a processor; and a non-transitory storage medium storing computer-readable instructions that upon execution on the processor cause the processor to:

measure a depth of a ground layer in the circuit board based on contact made between the conductive drill bit and the ground layer;

access data stored in a memory, the data comprising information of a thickness of the ground layer, and a thickness of a material between the ground layer and an electrical layer in the circuit board;

calculate a depth of the electrical layer based on the depth of the ground layer, the thickness of the ground layer in the accessed data, and the thickness of the material in the accessed data; and calculate a depth of a backdrill hole to the electrical layer based on the depth of the electrical layer.

2. The system of claim 1, wherein the computer-readable instructions upon execution cause the processor to direct the drilling machine to drill the backdrill hole that ends before reaching the electrical layer based on the depth of the electrical layer.

3. The system of claim 1, wherein the computer-readable instructions upon execution cause the processor to measure the depth of the ground layer while drilling a hole toward the ground layer in a primary drilling application.

4. The system of claim 1, further comprising a sensor communicatively coupled to the conductive drill bit, the sensor to sense an alteration to an electrical signal passing through the conductive drill bit.

5. The system of claim 4, wherein a ground connection is established with the ground layer of the circuit board, and the computer-readable instructions upon execution cause the processor to:

detect the contact made between the conductive drill bit and the ground layer based on the electrical signal being altered by the ground layer.

6. The system of claim 1, wherein the computer-readable instructions upon execution cause the processor to:

calculate the depth of the electrical layer by summing the depth of the ground layer, the thickness of the ground layer in the accessed data, and the thickness of the material in the accessed data.

7. The system of claim 1, further comprising a pressure foot coupled to the circuit board, wherein the computer-readable instructions upon execution cause the processor to:

measure a thickness of the circuit board via the pressure foot;

determine a thickness of the electrical layer;

calculate a combination of the depth of the electrical layer, the thickness of the electrical layer, and a tolerance measurement;

calculate the depth of the backdrill hole by subtracting the combination from the thickness of the circuit board; and direct the drilling machine to drill the backdrill hole in the circuit board in accordance with the calculated depth of the backdrill hole.

8. The system of claim 7, wherein the backdrill hole removes conductive material from a via in the circuit board.

9. The system of claim 7, wherein the thickness of the electrical layer is in the accessed data.

10. The system of claim 1, wherein the computer-readable instructions upon execution cause the processor to detect an outer layer of the circuit board based on an initial contact made between the conductive drill bit and the outer layer.

11. The system of claim 10, wherein the computer-readable instructions upon execution cause the processor to:

determine a first numerical representation of a position of the conductive drill bit when making the initial contact with the outer layer;

determine a second numerical representation of a further position of the conductive drill bit when making the contact with the ground layer; and calculate the depth of the ground layer by subtracting the first numerical representation from the second numerical representation.

12. An apparatus comprising:

a sensor to sense an alteration made to an electrical signal through a conductive drill bit of a drilling machine;

a processor; and a non-transitory storage medium storing computer-readable instructions that upon execution on the processor cause the processor to:

measure a depth of a ground layer in a circuit board based on contact detected between the conductive drill bit and the ground layer in response to an output of the sensor;

access data stored in a memory, the data comprising information of a thickness of the ground layer, and a thickness of a material between the ground layer and an electrical layer in the circuit board;

calculate a depth of the electrical layer based on the depth of the ground layer, the thickness of the ground layer in the accessed data, and the thickness of the material in the accessed data; and calculate a depth of a backdrill hole to the electrical layer based on the depth of the electrical layer.

13. The apparatus of claim 12, wherein the computer-readable instructions upon execution cause the processor to direct the drilling machine to drill the backdrill hole in the circuit board that ends before reaching the electrical layer based on the depth of the backdrill hole.

14. The apparatus of claim 12, wherein the computer-readable instructions upon execution cause the processor to measure the depth of the ground layer while drilling a hole toward the ground layer in a primary drilling application.

15. The apparatus of claim 12, wherein a ground connection is established with the ground layer of the circuit board, and the computer-readable instructions upon execution cause the processor to:

detect the contact made between the conductive drill bit and the ground layer based on the output of the sensor indicating the alteration made to the electrical signal by the ground layer.

16. The apparatus of claim 12, wherein the computer-readable instructions upon execution cause the processor to:

calculate the depth of the electrical layer by summing the depth of the ground layer, the thickness of the ground layer in the accessed data, and the thickness of the material in the accessed data.

17. The apparatus of claim 12, wherein the computer-readable instructions upon execution cause the processor to:

determine a thickness of the circuit board;

determine a thickness of the electrical layer;

calculate a combination of the depth of the electrical layer, a thickness of the electrical layer, and a tolerance measurement;

calculate the depth of the backdrill hole to be drilled in the circuit board by subtracting the combination from the thickness of the circuit board; and direct the drilling machine to drill the backdrill hole in the circuit board in accordance with the calculated depth of the backdrill hole.

18. The apparatus of claim 12, wherein the computer-readable instructions upon execution cause the processor to:

detect an outer layer of the circuit board based on an initial contact made between the conductive drill bit and the outer layer; and calculate the depth of the electrical layer further based on a position of the conductive drill bit when making the initial contact with the outer layer.

19. A method comprising:

measuring, by circuitry, a depth of a ground layer in a circuit board based on contact made between a conductive drill bit and the ground layer;

accessing, by the circuitry, data stored in a memory, the data comprising information of a thickness of the ground layer, and a thickness of a material between the ground layer and an electrical layer in the circuit board;

calculating, by the circuitry, a depth of the electrical layer based on the depth of the ground layer, the thickness of the ground layer in the accessed data, and the thickness of the material in the accessed data;

calculating, by the circuitry, a depth of a backdrill hole to the electrical layer based on the depth of the electrical layer; and directing, by the circuitry, a drilling machine to drill the backdrill hole that ends before the electrical layer based on the depth of the backdrill hole.

20. The method of claim 19, comprising:

calculating, by the circuitry, the depth of the electrical layer by summing the depth of the ground layer, the thickness of the ground layer in the accessed data, and the thickness of the material in the accessed data.

* * * * *